United States Patent
Sakashita

(10) Patent No.: US 10,270,422 B2
(45) Date of Patent: Apr. 23, 2019

(54) PIEZOELECTRIC THIN FILM RESONATOR, FILTER, AND MULTIPLEXER

(71) Applicant: TAIYO YUDEN CO., LTD., Tokyo (JP)

(72) Inventor: Takeshi Sakashita, Tokyo (JP)

(73) Assignee: TAIYO YUDEN CO., LTD, Tokyo (JP)

(*) Notice: Subject to any disclaimer, the term of this patent is extended or adjusted under 35 U.S.C. 154(b) by 1 day.

(21) Appl. No.: 15/434,975

(22) Filed: Feb. 16, 2017

(65) Prior Publication Data

US 2017/0338798 A1    Nov. 23, 2017

(30) Foreign Application Priority Data

May 18, 2016    (JP) .................. 2016-099943

(51) Int. Cl.
| | |
|---|---|
| H03H 9/17 | (2006.01) |
| H03H 9/56 | (2006.01) |
| H03H 9/54 | (2006.01) |
| H03H 9/70 | (2006.01) |
| H03H 3/02 | (2006.01) |
| H03H 9/13 | (2006.01) |

(52) U.S. Cl.
CPC ............. *H03H 9/171* (2013.01); *H03H 3/02* (2013.01); *H03H 9/131* (2013.01); *H03H 9/173* (2013.01); *H03H 9/54* (2013.01); *H03H 9/564* (2013.01); *H03H 9/568* (2013.01); *H03H 9/70* (2013.01); *H03H 2003/021* (2013.01)

(58) Field of Classification Search
CPC .......... H03H 3/02; H03H 9/131; H03H 9/171; H03H 9/173; H03H 9/54; H03H 9/564; H03H 9/568; H03H 9/70; H03H 2003/021

USPC .......................... 333/133, 187, 188; 310/312
See application file for complete search history.

(56) References Cited

U.S. PATENT DOCUMENTS

| | | | | |
|---|---|---|---|---|
| 7,602,101 | B2 * | 10/2009 | Hara | ........................ H03H 3/04 310/320 |
| 2005/0264137 | A1 | 12/2005 | Taniguchi et al. | |
| 2008/0143215 | A1 | 6/2008 | Hara et al. | |

(Continued)

FOREIGN PATENT DOCUMENTS

| | | |
|---|---|---|
| JP | 2005-151353 A | 6/2005 |
| JP | 2005-347898 A | 12/2005 |

(Continued)

OTHER PUBLICATIONS

Japanese Office Action dated Jan. 8, 2019, in a counterpart Japanese patent application No. 2016-099943. (A machine translation (not reviewed for accuracy) attached.).

*Primary Examiner* — Robert J Pascal
*Assistant Examiner* — Jorge L Salazar, Jr.
(74) *Attorney, Agent, or Firm* — Chen Yoshimura LLP

(57) ABSTRACT

A piezoelectric thin film resonator includes: a substrate; a piezoelectric film that is located on the substrate; a lower electrode that is located on the substrate through an air gap, makes contact with the piezoelectric film, and includes a thin film part and a thick film part in which a distance from the air gap to a surface making contact with the piezoelectric film is greater than that of the thin film part in a region overlapping with the air gap in plan view; and an upper electrode that is located on an opposite surface of the piezoelectric film from a surface making contact with the lower electrode.

12 Claims, 22 Drawing Sheets

(56) References Cited

U.S. PATENT DOCUMENTS

2012/0200199 A1    8/2012  Taniguchi et al.
2012/0299664 A1*  11/2012  Hara .................... H03H 9/0211
                                                                      333/133
2014/0210570 A1*   7/2014  Nishihara ................ H03H 9/70
                                                                      333/133

FOREIGN PATENT DOCUMENTS

JP         2008-109414 A    5/2008
JP         2011-91639 A     5/2011

* cited by examiner

PIEZOELECTRIC THIN FILM RESONATOR, FILTER, AND MULTIPLEXER

CROSS-REFERENCE TO RELATED APPLICATION

This application is based upon and claims the benefit of priority of the prior Japanese Patent Application No. 2016-099943, filed on May 18, 2016, the entire contents of which are incorporated herein by reference.

FIELD

A certain aspect of the present invention relates to a piezoelectric thin film resonator, a filter, and a multiplexer.

BACKGROUND

Acoustic wave devices using piezoelectric thin film resonators have been used as filters and multiplexers of wireless devices such as, for example, mobile phones. The piezoelectric thin film resonator has a structure designed to have a lower electrode and an upper electrode facing each other across a piezoelectric film as disclosed in Japanese Patent Application Publication No. 2005-347898 (Patent Document 1). The region where the lower electrode and the upper electrode face each other across the piezoelectric film is a resonance region. An air gap is located under the resonance region so that the oscillation is not restrained. The air gap is located so as to include the resonance region in plan view.

Since the resonance region is included in the air gap, the strength of the multilayered film including the lower electrode, the piezoelectric film, and the upper electrode in the resonance region is low. Thus, when a stress is applied to the multilayered film, especially the lower electrode of the multilayered film is mechanically broken—for example, a crack is formed.

SUMMARY OF THE INVENTION

According to a first aspect of the present invention, there is provided a piezoelectric thin film resonator including: a substrate; a piezoelectric film that is located on the substrate; a lower electrode that is located on the substrate through an air gap, makes contact with the piezoelectric film, and includes a thin film part and a thick film part in which a distance from the air gap to a surface making contact with the piezoelectric film is greater than that in the thin film part in a region overlapping with the air gap in plan view; and an upper electrode that is located on an opposite surface of the piezoelectric film from a surface making contact with the lower electrode.

According to a second aspect of the present invention, there is provided a filter including the above piezoelectric thin film resonator.

According to a third aspect of the present invention, there is provided a multiplexer including the above filter.

DETAILED DESCRIPTION

Hereinafter, a description will be given of embodiments of the present invention with reference to the accompanying drawings.

First Embodiment

Figure 1A:
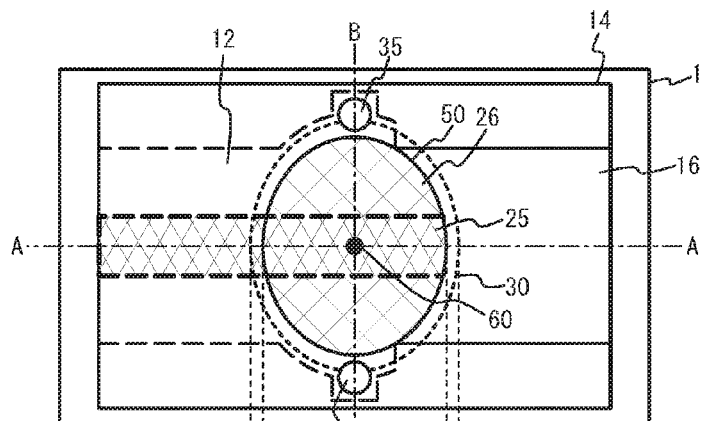
FIG. 1A is a plan view of a piezoelectric thin film resonator in accordance with a first embodiment.
Figure 1B:
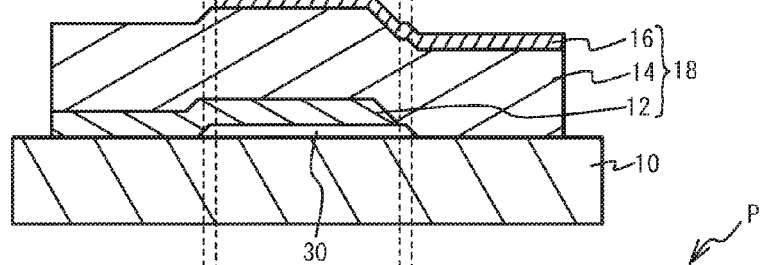
FIG. 1B and FIG. 1C are cross-sectional views taken along line A-A in FIG. 1A.
Figure 1C:
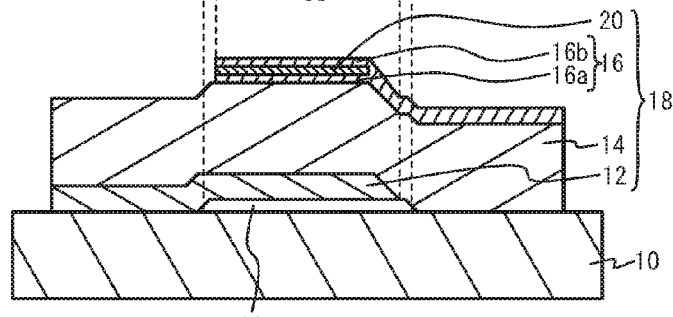
Figure 1D:
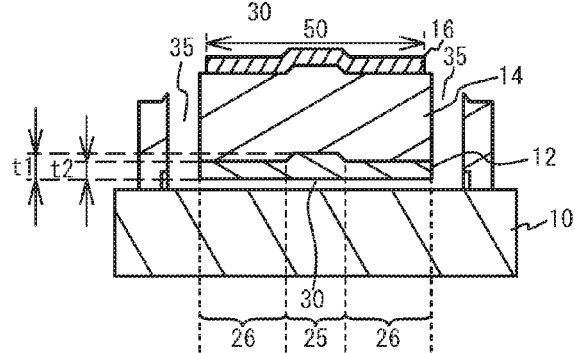
FIG. 1D is a cross-sectional view taken along line B-B in FIG. 1A.

FIG. 1A is a plan view of a piezoelectric thin film resonator in accordance with a first embodiment, FIG. 1B and FIG. 1C are cross-sectional views taken along line A-A in FIG. 1A, and FIG. 1D is a cross-sectional view taken along line B-B in FIG. 1A. FIG. 1B illustrates, for example, a series resonator of a ladder-type filter, and FIG. 1C illustrates, for example, a parallel resonator of a ladder-type filter.

With reference to FIG. 1A, FIG. 1B, and FIG. 1D, the structure of a series resonator S will be described. A lower electrode 12 is located on a substrate 10 that is a silicon (Si) substrate. An air gap 30 having a dome-shaped bulge is formed between the flat principal surface of the substrate 10 and the lower electrode 12. The dome-shaped bulge is a bulge having a shape in which the height of the air gap 30 is low in the periphery of the air gap 30, and increases at distances closer to the center of the air gap 30, for example. FIG. 1B through FIG. 1D illustrate a dome-shaped air gap by a trapezoidal cross-section. The same applies the drawings hereinafter.

The lower electrode 12 includes, for example, a chrome (Cr) film and a ruthenium (Ru) film located on the Cr film. The lower electrode 12 includes a thick film part 25 and a thin film part 26. The distance between the upper surface of the lower electrode 12 (i.e., the surface making contact with the piezoelectric film 14) and the air gap 30 (i.e., the upper surface of the air gap 30) in the thick film part 25 is a distance t1. The distance between the upper surface of the lower electrode 12 and the air gap 30 in the thin film part 26 is a distance t2. The distance t1 is greater than the distance t2.

Located on the lower electrode 12 is a piezoelectric film 14 mainly composed of aluminum nitride (AlN) having the main axis in the (002) direction. An upper electrode 16 is located on the piezoelectric film 14 so as to have a region (a resonance region 50) in which the upper electrode 16 faces the lower electrode 12 across the piezoelectric film 14. That is, the upper electrode 16 is located on an opposite surface of the piezoelectric film 14 from the surface making contact with the lower electrode 12. The resonance region 50 has an elliptical shape, and is a region in which an acoustic wave in the thickness extension mode resonates. The resonance region 50 is formed so as to be the same as or smaller than the air gap 30, and so as to overlap with the air gap 30 in plan view. The upper electrode 16 includes, for example, a Ru film and a Cr film located on the Ru film.

A silicon oxide film as a frequency adjusting film (not illustrated) is located on the upper electrode 16. A multilayered film 18 in the resonance region 50 includes the lower electrode 12, the piezoelectric film 14, the upper electrode 16, and the frequency adjusting film. The frequency adjusting film may function as a passivation film.

As illustrated in FIG. 1A and FIG. 1D, a hole portion 35 for etching a sacrifice layer is formed in the piezoelectric film 14 and the lower electrode 12. The sacrifice layer is a layer for forming the air gap 30. The hole portion 35 is communicated with the air gap 30.

With reference to FIG. 1C, the structure of a parallel resonator P will be described. The parallel resonator P differs from the series resonator S in that an additional film 20 made of a titanium (Ti) layer is located between a lower layer 16a (e.g., a Ru film) and an upper layer 16b (e.g., a Cr film) of the upper electrode 16. Thus, the multilayered film 18 includes the additional film 20 formed across the entire surface in the resonance region 50 in addition to the multi-layered film of the series resonator S. Other structures are the same as those of the series resonator S illustrated in FIG. 1B, and the description thereof is thus omitted.

The difference in resonant frequency between the series resonator S and the parallel resonator P is adjusted with the film thickness of the additional film 20. The resonant frequency of each of the series resonator S and the parallel resonator P is adjusted with the film thickness of the corresponding frequency adjusting film.

A piezoelectric thin film resonator with a resonant frequency of 3.5 GHz may be configured as follows. The thick film part 25 of the lower electrode 12 is formed of a Cr film with a film thickness of 50 nm and a Ru film with a film thickness of 105 nm. The thin film part 26 of the lower electrode 12 is formed of a Cr film with a film thickness of 50 nm and a Ru film with a film thickness of 95 nm. The piezoelectric film 14 is an AlN film with a film thickness of 713 nm. The upper electrode 16 is formed of a Ru film with a film thickness of 105 nm (the lower layer 16a) and a Cr film with a film thickness of 20 nm (the upper layer 16b). The frequency adjusting film is a silicon oxide film with a film thickness of 10 nm. The additional film 20 is a Ti film with a film thickness of 40 nm. The film thickness of each layer can be appropriately designed to achieve desired resonance characteristics.

The substrate 10 may be, instead of a Si substrate, a sapphire substrate, a spinel substrate, an alumina substrate, a quartz substrate, a glass substrate, a ceramic substrate, or a GaAs substrate. The lower electrode 12 and the upper electrode 16 may be formed of, instead of Ru and Cr, a single-layer film of Al, Ti, Cu, molybdenum (Mo), tungsten (W), Ta, Pt, rhodium (Rh), or iridium (Ir), or a multilayered film of at least two of them. For example, the lower layer 16a of the upper electrode 16 may be made of Ru, and the upper layer 16b may be made of Mo.

The piezoelectric film 14 may be made of, instead of aluminum nitride, zinc oxide (ZnO), lead zirconate titanate (PZT), or lead titanate (PbTiO$_3$). Alternatively, for example, the piezoelectric film 14 may be mainly composed of aluminum nitride, and may contain other elements for improving the resonance characteristic or the piezoelectricity. For example, the use of scandium (Sc), a divalent element and a tetravalent element, or a divalent element and a pentavalent element as additive elements can improve the piezoelectricity of the piezoelectric film 14. Accordingly, the effective electromechanical coupling coefficient of the piezoelectric thin film resonator can be improved. The divalent element is, for example, calcium (Ca), magnesium (Mg), strontium (Sr), or zinc (Zn). The tetravalent element is, for example, Ti, zirconium (Zr), or hafnium (Hf). The pentavalent element is, for example, Ta, niobium (Nb), or vanadium (V). Yet alternatively, the piezoelectric film 14 may be mainly composed of aluminum nitride, and may contain boron (B).

The frequency adjusting film may be, instead of a silicon oxide film, a silicon nitride film, or an aluminum nitride. The additional film 20 may be, instead of a single-layer film of Ti, a single-layer film of Ru, Cr, Al, Cu, Mo, W, Ta, Pt, Rh, or Ir. Alternatively, the additional film 20 may be an insulating film made of, for example, metal nitride such as silicon nitride or metal oxide such as silicon oxide. The additional film 20 may be formed, instead of between the layers of the upper electrode 16 (between the Ru film and the Cr film), under the lower electrode 12, between the layers of the lower electrode 12, on the upper electrode 16, between the lower electrode 12 and the piezoelectric film 14, or between the piezoelectric film 14 and the upper electrode 16. The additional film 20 may be larger than the resonance region 50 as long as the additional film 20 includes the resonance region 50.

Figure 2A:
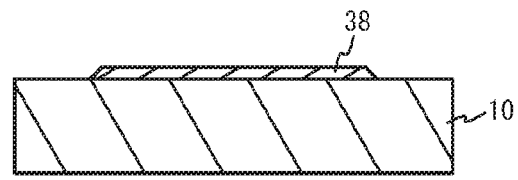
FIG. 2A through FIG. 2D are cross-sectional views (No. 1) illustrating a method of fabricating a series resonator of the first embodiment.

FIG. 2A through FIG. 3D are cross-sectional views illustrating a method of fabricating the series resonator of the first embodiment. As illustrated in FIG. 2A, a sacrifice layer 38 for forming an air gap is formed on the substrate 10 having a flat principal surface. The sacrifice layer 38 has a film thickness of, for example, 10 to 100 nm, and may be made of a material selected from materials such as magnesium oxide (MgO), ZnO, germanium (Ge), or silicon oxide ($SiO_2$), which easily dissolves in an etching liquid or an etching gas. Then, the sacrifice layer 38 is patterned into a desired shape by photolithography and etching. The shape of the sacrifice layer 38 corresponds to the planar shape of the air gap 30, and includes a region to be, for example, the resonance region 50. The sacrifice layer 38 is formed by, for example, sputtering, vacuum evaporation, or Chemical Vapor Deposition (CVD).

Figure 2B:
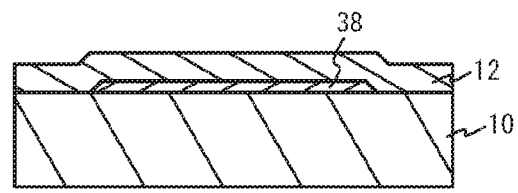
Figure 2C:
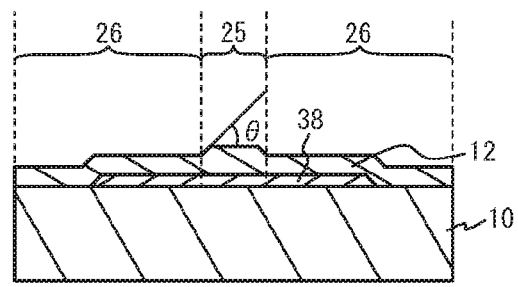
Figure 2D:
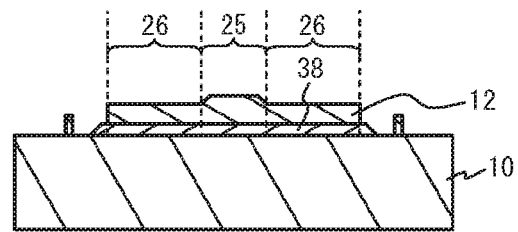

As illustrated in FIG. 2B, the lower electrode 12 is formed on the sacrifice layer 38 and the substrate 10. The lower electrode 12 is formed by, for example, sputtering, vacuum evaporation, or CVD. As illustrated in FIG. 2C, a part, which is to be the thin film part 26, of the lower electrode 12 is thinned by photolithography and etching. The etched region of the lower electrode 12 forms the thin film part 26, and the unetched region forms the thick film part 25. The angle θ between the side surface of the level difference between the thick film part 25 and the thin film part 26 and the upper surface of the lower electrode 12 is preferably 30° or less. This structure can inhibit cracks from being formed in the piezoelectric film 14. As illustrated in FIG. 2D, the lower electrode 12 is patterned by photolithography and etching. The lower electrode 12 may be formed by liftoff.

Figure 3A:
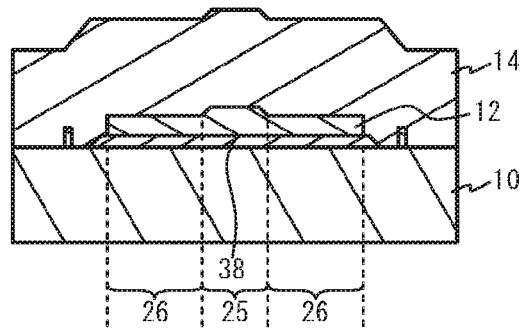
FIG. 3A through FIG. 3D are cross-sectional views (No. 2) illustrating the method of fabricating the series resonator of the first embodiment.
Figure 3B:
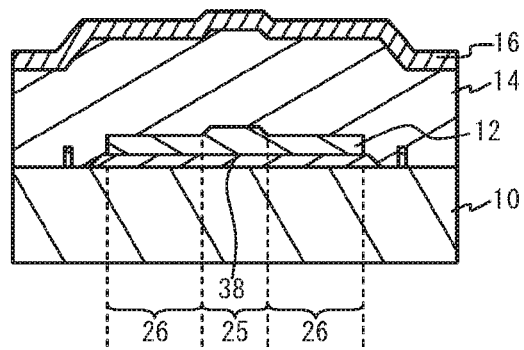
Figure 3C:
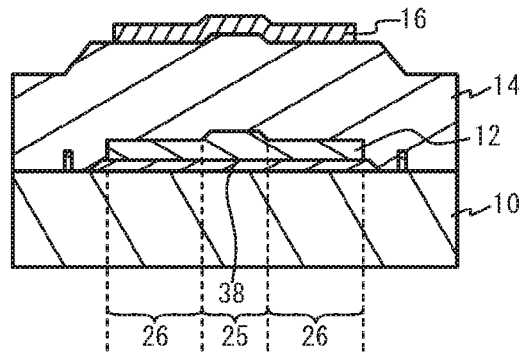
Figure 3D:
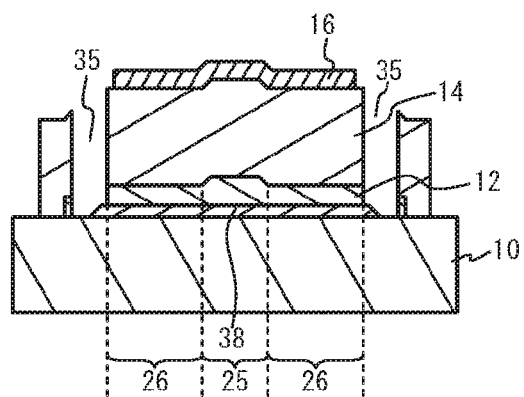

As illustrated in FIG. 3A, the piezoelectric film 14 is formed on the lower electrode 12 and the substrate 10 by, for example, sputtering, vacuum evaporation, or CVD. As illustrated in FIG. 3B, the upper electrode 16 is formed by sputtering, vacuum evaporation, or CVD. As illustrated in FIG. 3C, the upper electrode 16 is patterned into a desired shape by photolithography and etching. The upper electrode 16 may be formed by liftoff. As illustrated in FIG. 3D, the piezoelectric film 14 is patterned into a desired shape by photolithography and etching In the parallel resonator P illustrated in FIG. 1C, the additional film 20 is formed by, for example, sputtering, vacuum evaporation, or CVD after the lower layer 16a of the upper electrode 16 is formed. The additional film 20 is patterned into a desired shape by photolithography and etching. Then, the upper layer 16b of the upper electrode 16 is formed.

A frequency adjusting film is formed by, for example, sputtering or CVD. The frequency adjusting film is patterned into a desired shape by photolithography and etching.

An etching liquid for the sacrifice layer 38 is introduced into the sacrifice layer 38 under the lower electrode 12 through the hole portion 35. This process removes the sacrifice layer 38. A substance for etching the sacrifice layer 38 is preferably a substance that does not etch materials constituting the resonator except the sacrifice layer 38. Especially, the substance for etching is preferably a substance that does not etch the lower electrode 12 with which the substance for etching comes in contact. The stress on the multilayered film 18 (see FIG. 1B through FIG. 1D) are set to a compression stress. This setting causes the multilayered film 18 to bulge toward the opposite side from the substrate 10 so as to separate from the substrate 10 when the sacrifice layer 38 is removed. The air gap 30 having a dome-shaped bulge is formed between the lower electrode 12 and the substrate 10. The above-described processes make the series resonator S illustrated in FIG. 1A and FIG. 1B and the parallel resonator P illustrated in FIG. 1A and FIG. 1C.

Figure 4A:
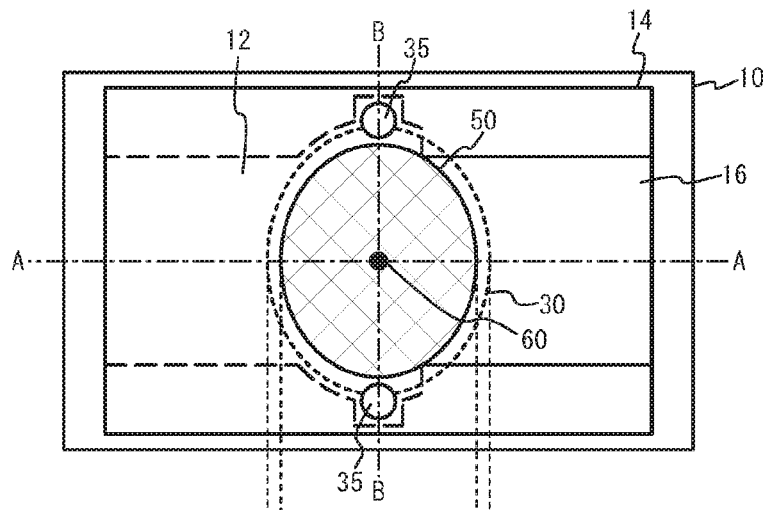
FIG. 4A is a plan view of a piezoelectric thin film resonator in accordance with a first comparative example.
Figure 4B:
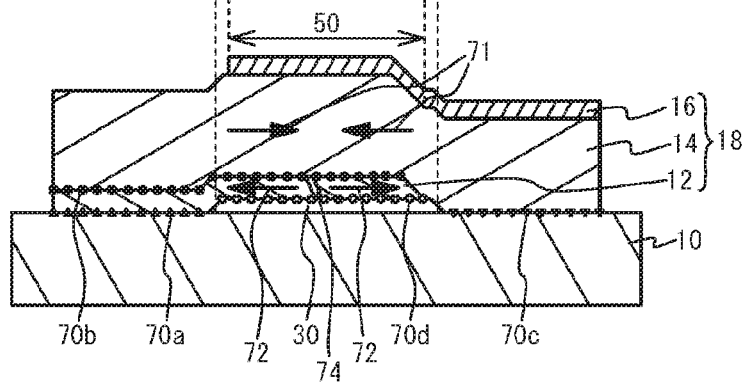
FIG. 4B is a cross-sectional view taken along line A-A in FIG. 4A.
Figure 4C:
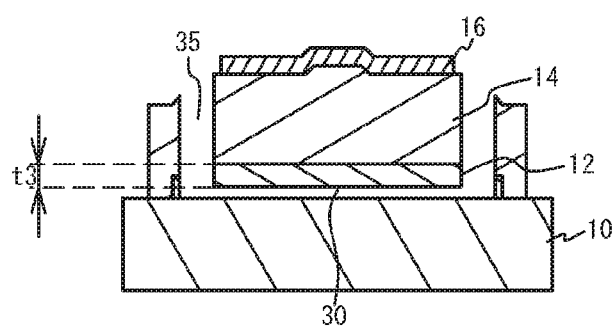
FIG. 4C is a cross-sectional view taken along line B-B in FIG. 4A.

To describe the advantages of the first embodiment, a description will be given of problems of a comparative example. FIG. 4A is a plan view of a piezoelectric thin film resonator in accordance with a first comparative example, FIG. 4B is a cross-sectional view taken along line A-A in FIG. 4A, and FIG. 4C is a cross-sectional view taken along line B-B in FIG. 4A. As illustrated in FIG. 4A through FIG. 4C, in the first comparative example, the lower electrode 12 includes neither the thick film part 25 nor the thin film part 26. In the resonance region 50, the distance t3 between the air gap 30 and the upper surface of the lower electrode 12 is uniform. Other structures are the same as those of the first embodiment, and the description thereof is omitted.

In the piezoelectric thin film resonator, the resonance phenomenon occurs at a frequency at which the total film thickness H of the multilayered film 18 is approximately equal to integral multiples n of a half of the wavelength λ of the acoustic wave (i.e., at a frequency at which H=nλ/2). When the propagation velocity of the acoustic wave determined by the material of the piezoelectric film 14 is represented by V, the resonant frequency fr is expressed by fr=nV/(2H). As described above, to increase the resonant frequency fr, the film thickness of the multilayered film 18 is reduced.

As illustrated in FIG. 4B, the lower electrode 12 is fixed to the substrate 10 at a boundary face 70a (indicated by ▲ in FIG. 4B). The piezoelectric film 14 is fixed to the lower electrode 12 at a boundary face 70b (indicated by ● in FIG. 4B) and is fixed to the substrate 10 at a boundary face 70c (indicated by ▼ in FIG. 4B). In the resonance region 50, a lower surface 70d of the lower electrode 12 (indicated by ○ in FIG. 4B) is unfixed, and the multilayered film 18 is not fixed to the substrate 10.

The multilayered film 18 has an internal stress. For example, to form the dome-shaped air gap 30, the multilayered film 18 has a compression stress (i.e., a stress causing the multilayered film 18 to bulge) as indicated by arrows 71. The lower electrode 12 and the piezoelectric film 14 are fixed outside the resonance region 50, and the lower electrode 12 is unfixed in the resonance region 50. Thus, a stress pulling the lower electrode 12 is generated as indicated by arrows 72.

When the resonant frequency fr is increased to make the passband of the filter high, the multilayered film 18 is thinned. Especially when the resonant frequency fr is made to be 3 GHz or greater, the multilayered film 18 becomes very thin. Thus, the strength of the multilayered film 18 decreases. Since the stress indicated by the arrows 72 is applied especially to the lower electrode 12, a crack 74 is formed in the lower electrode 12. When a crack is formed in the lower electrode 12, the piezoelectric film 14 may be broken. Especially when boron or the like is added to the piezoelectric film 14, the piezoelectric film 14 is hard, and the piezoelectric film 14 is thus easily broken. In addition, the lower electrode 12 is deformed, and the deformation of the lower electrode 12 may etch the piezoelectric film 14 in the fabrication process, forming a cavity.

In addition, the difference in internal stress between the upper electrode 16 and the piezoelectric film 14 pulls or compresses the multilayered film 18 in the direction of the extraction region of the upper electrode 16. Thus, the multilayered film 18 is easily mechanically damaged also between a center 60 of the region overlapping with the air gap 30 in plan view and the extraction region of the upper electrode 16. The center 60 of the region overlapping with the air gap 30 in plan view substantially corresponds to the center of the resonance region 50.

As described above, the multilayered film 18 of the resonance region 50 is mechanically damaged. When the lower electrode 12 is made to be thick, the strength of the lower electrode 12 can be increased. However, when the lower electrode 12 is thickened, the piezoelectric film 14 is thinned. This structure decreases the Q-value.

Made was the piezoelectric thin film resonator of the first comparative example using the materials and film thicknesses exemplified in the piezoelectric thin film resonator with a resonant frequency of 3.5 GHz in the first embodiment. The film thickness of the lower electrode 12 is uniform, and the Ru film has a film thickness of 111 nm. The resonance region 50 has a minor axis length of 68 µm and a major axis length of 124 µm. The location where a crack is formed was observed in the first comparative example.

Figure 5:
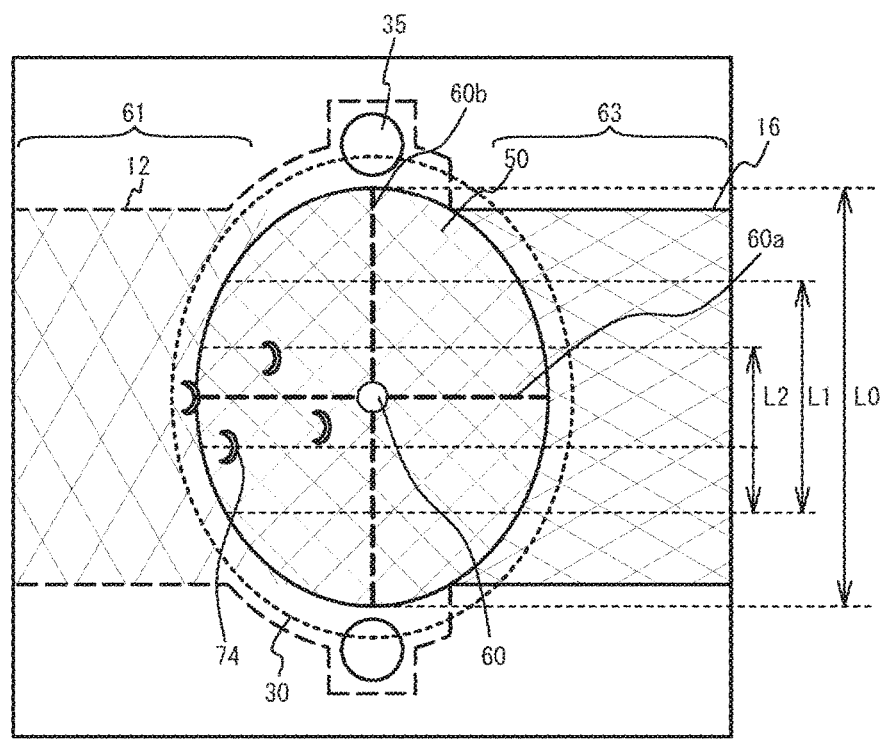
FIG. 5 illustrates locations where a crack is formed in the first comparative example.

FIG. 5 illustrates locations where cracks were formed in the first comparative example. As illustrated in FIG. 5, when the resonance region 50 has an elliptical shape, the center, the minor axis, and the major axis of the elliptical shape are respectively defined as the center 60, a minor axis 60a, and a major axis 60b. An extraction region 61 of the lower electrode 12 and an extraction region 63 of the upper electrode 16 are located in the minor axis 60a direction. The crack 74 was formed in the lower electrode 12 in some of the piezoelectric thin film resonators. When observed from above with a microscope, the crescentic crack 74 longer in the major axis 60b direction is observed. The dimension of the crack 74 in the major axis 60b direction is, for example, 5 to 20 µm. In the piezoelectric thin film resonators in which the crack 74 was formed, one crack 74 is formed in the region overlapping with the air gap 30 in plan view in many cases. FIG. 5 illustrates the locations where the crack 74 was formed in the piezoelectric thin film resonators.

When the major axis 60b has a length of 124 µm, the cracks 74 concentrate in an area with a width L2 of 25 µm with the minor axis 60a at its center. The crack 74 is not observed outside an area with a width L1 of 80 µm with the minor axis 60a at its center.

As illustrated in FIG. 4B, in the extraction region of the lower electrode 12, the lower electrode 12 is fixed to the substrate 10. Thus, in the minor axis direction, a large stress is produced in the lower electrode 12. This is considered the reason that the crack 74 is formed near the minor axis 60a. For example, as illustrated in FIG. 4C, in the major axis direction, the lower electrode 12 is not fixed to the substrate 10, and it is considered that a stress applied to the lower electrode 12 is small. Thus, the thick film part 25 is formed near the minor axis 60a around which the stress applied to the lower electrode 12 is large and the crack 74 is easily formed, and the other regions are made to be the thin film part 26. The thick film part 25 can reduce the crack 74. In addition, the provision of the thin film part 26 can reduce the crack 74 without decreasing the ratio of the piezoelectric film 14 in the multilayered film 18, and can inhibit the deterioration of the Q-value.

To form the thick film part 25 in an area where the crack 74 is easily formed, the width W of the thick film part 25 (see FIG. 1A) is preferably made to be 25 µm or greater and 80 µm or less with a line passing through the center 60 as its center. The width W is preferably greater than or equal to 20% of and less than or equal to 60% of the length L0 of the resonance region 50 in the width W direction of the thick film part 25. The width W is more preferably greater than or equal to 30% of and less than or equal to 50% of the length L0 of the resonance region 50.

Between the first embodiment and the first comparative example, the volume of the lower electrode 12 in the resonance region 50 is made to be the same to make the resonant frequency fr and the Q-value be the same. At this time, the distance t2 (see FIG. 1D) in the thick film part 25 in the first embodiment is preferably equal to or greater than 1.1 times and equal to or less than 2 times the distance t3 (see FIG. 4C) in the lower electrode 12 in the first comparative example, more preferably equal to or greater than 1.25 times and equal to or less than 1.5 times.

Figure 6A:
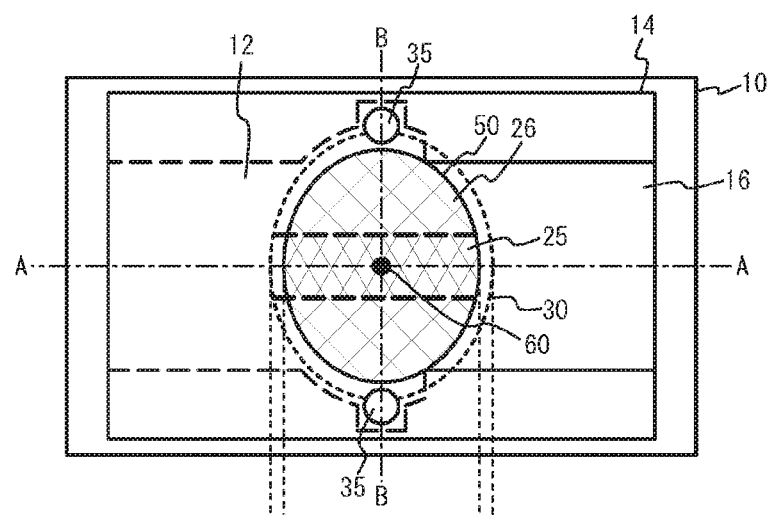
FIG. 6A is a plan view of a piezoelectric thin film resonator in accordance with a first variation of the first embodiment.
Figure 6B:
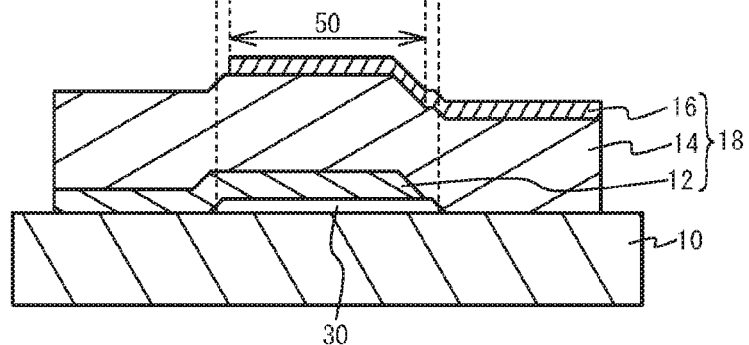
FIG. 6B is a cross-sectional view taken along line A-A in FIG. 6A.

FIG. 6A is a plan view of a piezoelectric thin film resonator in accordance with a first variation of the first embodiment, and FIG. 6B is a cross-sectional views taken along line A-A in FIG. 6A. As illustrated in FIG. 6A and FIG. 6B, the thick film part 25 is located only on the air gap 30. Other structures are the same as those of the first embodiment, and the description thereof is thus omitted.

In the first embodiment, the thick film part 25 is located in the extraction region 61. Even in the extraction region 61, a certain amount of stress is applied to the lower electrode 12. Thus, compared to the first variation of the first embodiment, the first embodiment can further reinforce the lower electrode 12.

Meanwhile, when the thick film part 25 is formed in the extraction region 61, unevenness is formed, and may cause the instability of the fabrication process. In the first variation of the first embodiment, since no thick film part 25 is formed in the extraction region 61, the fabrication process after the forming of the lower electrode 12 can be stabilized.

Figure 7A:
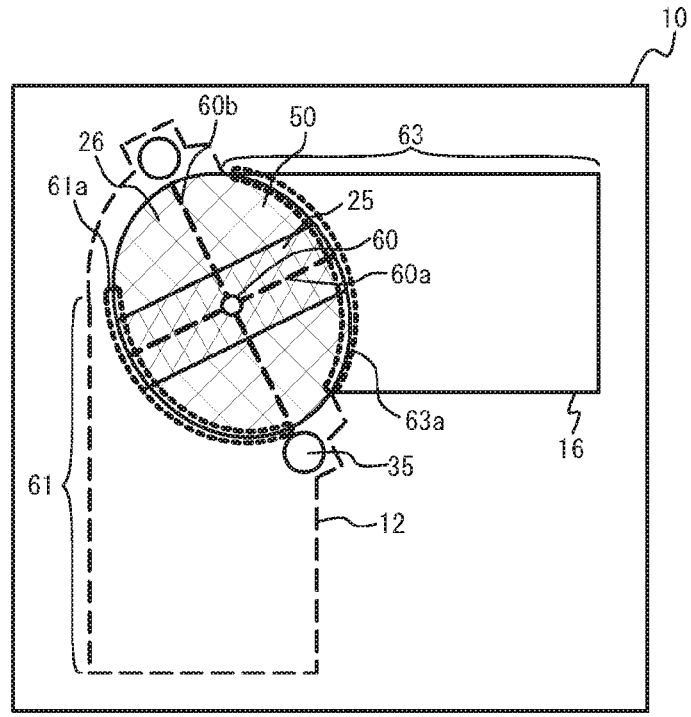
FIG. 7A and FIG. 7B are plan views of piezoelectric thin film resonators in accordance with second and third variations of the first embodiment, respectively.
Figure 7B:
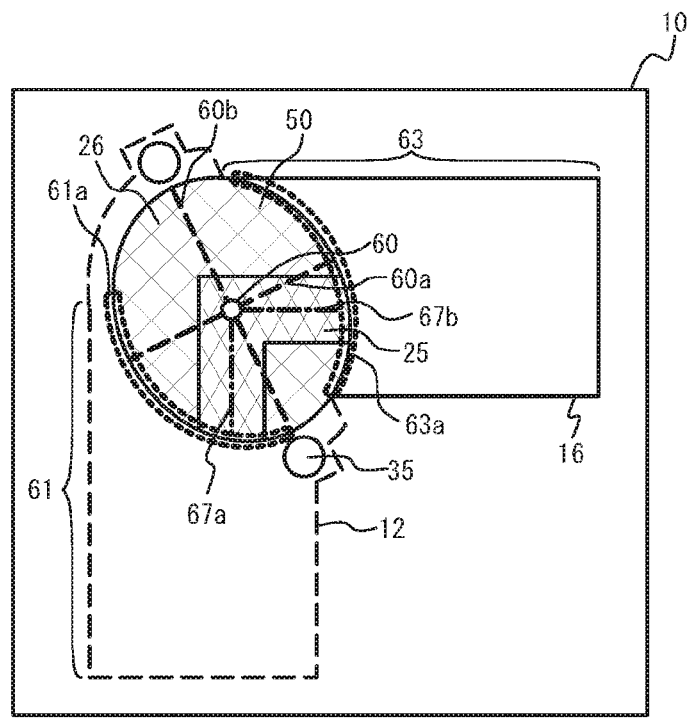

FIG. 7A and FIG. 7B are plan views of piezoelectric thin film resonators in accordance with second and third variations of the first embodiment. As illustrated in FIG. 7A, the extraction region 61 of the lower electrode 12 and the extraction region 63 of the upper electrode 16 are inclined with respect to the minor axis 60a. The directions of the extraction regions 61 and 63 intersect substantially at a right angle. The thin film part 26 is formed so as to include the minor axis 60a. Other structures are the same as those of the first variation of the first embodiment, and the description thereof is thus omitted.

As illustrated in FIG. 7B, a line extending in a direction from the center 60 to the extraction region 61 is defined as a line 67a, and a line extending in a direction from the center 60 to the extraction region 63 is defined as a line 67b. The thick film part 25 is formed so as to include the lines 67a and 67b. Other structures are the same as those of the second variation of the first embodiment, and the description thereof is thus omitted.

When the directions of the extraction regions 61 and 63 are inclined with respect to the minor axis 60a, the area where the crack 74 is easily formed is an area near the minor axis 60a or an area near the lines 67a and 67b. When the crack 74 is formed in an area in which the stress easily concentrates, the crack 74 is formed near the minor axis 60a. In this case, the second variation of the first embodiment is preferably employed. When the crack 74 is formed in the direction of the stress of the lower electrode 12, a crack is formed near the lines 67a and 67b. In this case, the third variation of the first embodiment is preferably employed. Whether the crack 74 is easily formed near the minor axis 60a or near the lines 67a and 67b depends on the materials and the structure.

Figure 8:
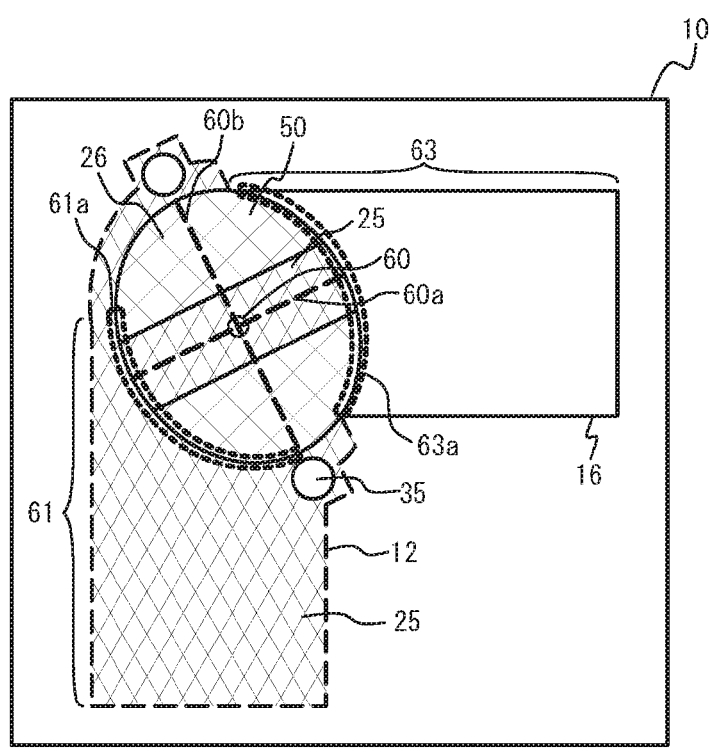
FIG. 8 is a plan view of a piezoelectric thin film resonator in accordance with a fourth variation of the first embodiment.

FIG. 8 is a plan view of a piezoelectric thin film resonator in accordance with a fourth variation of the first embodiment. As illustrated in FIG. 8, the entire of the lower electrode 12 other than the lower electrode 12 in the resonance region 50 is the thick film part 25. Other structures are the same as those of the second variation of the first embodiment, and the description thereof is thus omitted. As described in the fourth variation of the first embodiment, the entire of the lower electrode 12 other than the lower electrode 12 in the resonance region 50 may be the thick film part 25.

Figure 9A:
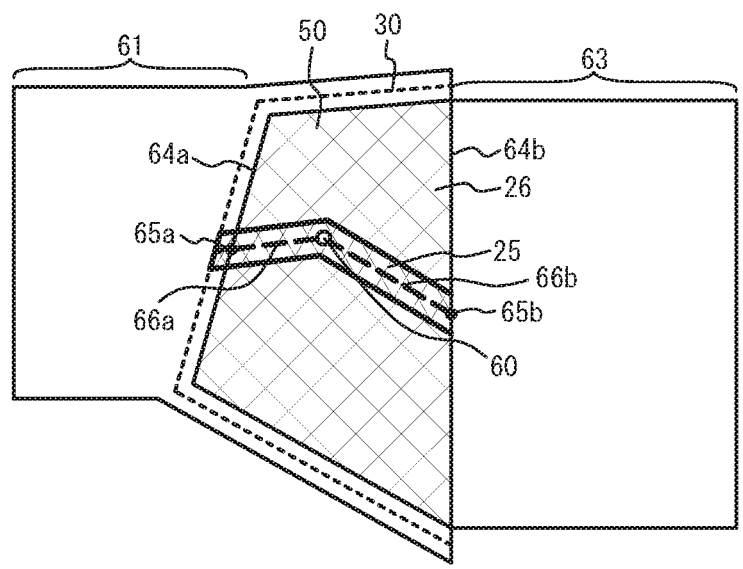
FIG. 9A and FIG. 9B are plan views of piezoelectric thin film resonators in accordance with fifth and sixth variations of the first embodiment, respectively.
Figure 9B:
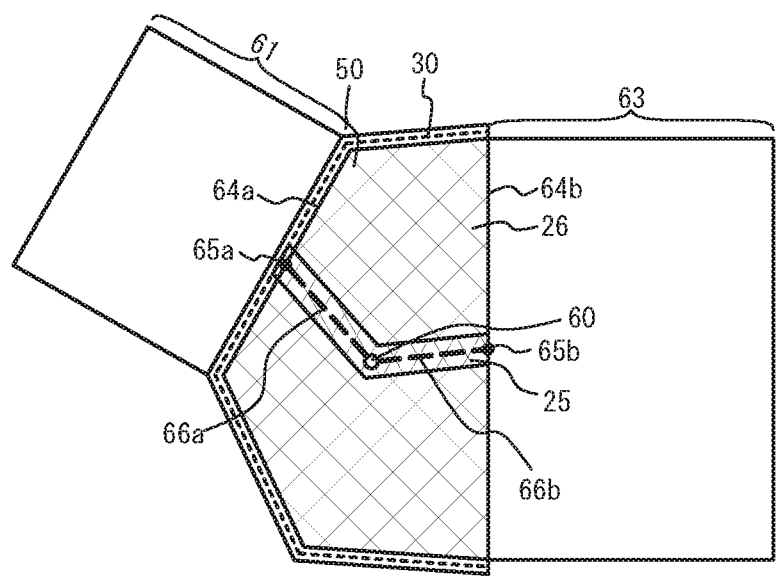

FIG. 9A and FIG. 9B are plan views of piezoelectric thin film resonators in accordance with fifth and sixth variations of the first embodiment, respectively. As illustrated in FIG. 9A, the resonance region 50 has a quadrangle shape. As illustrated in FIG. 9B, the resonance region 50 has a pentagonal shape. A side of the resonance region 50 on which the extraction region 61 of the lower electrode 12 is located is defined as a side 64a. A side of the resonance region 50 on which the extraction region 63 of the upper electrode 16 is located is defined as a side 64b. The midpoints of the sides 64a and 64b are respectively midpoints 65a and 65b. The line connecting the center 60 and the midpoint 65a is defined as a line 66a, and the line connecting the center 60 and the midpoint 65b is defined as a line 66b. The thick film part 25 is formed so as to include the lines 66a and 66b. The center 60 is a center of gravity of, for example, the region overlapping with the air gap 30 in plan view (i.e., the resonance region 50). The center 60 may be the center of the inscribed circle of a polygon or the center of the circumscribed circle of a polygon. Other structures are the same as those of the first variation of the first embodiment, and the description thereof is thus omitted.

In the first embodiment and the first through sixth variations thereof, the lower electrode 12 includes the thin film part 26 and the thick film part 25 in a region overlapping with the air gap 30 in plan view. The area in which the crack 74 is easily formed in the multilayered film 18 such as the lower electrode 12 is made to be the thick film part 25, and the area in which the crack 74 is hardly formed is made to be the thin film part 26. The thick film part 25 can reduce the crack 74, and enhance the strength of the multilayered film 18. The deterioration of the Q-value and the like can be inhibited by making the area of the thick film part 25 in the resonance region 50 small and making the area of the thin film part 26 in the resonance region 50 large.

In addition, a stress is applied to the lower electrode 12 in the resonance region 50 in the directions of the extraction region 61 of the lower electrode 12 and the extraction region 63 of the upper electrode 16. Therefore, the crack 74 is easily formed near lines connecting the center 60 and the extraction regions 61 and 63 to which the lower electrode 12 and the upper electrode 16 are respectively extracted from the resonance region 50. That is, in FIG. 7A through FIG. 8, the crack 74 is easily formed near a line connecting the center 60 and any point on outer peripheries 61a and 63a, which are respectively closer to the extraction regions 61 and 63, of the resonance region 50. In FIG. 9A and FIG. 9B, a crack is easily formed near a line connecting the center 60 and any point on the sides 64a and 64b.

Thus, the thick film part 25 is formed in a strip shape including at least a part of at least one of lines connecting the center 60 and the extraction regions 61 and 63. This structure can inhibit the crack 74 from being formed in the lower electrode 12.

Furthermore, a stress is applied to the lower electrode 12 in the resonance region 50 in a direction from the center 60 to the extraction region 61 of the lower electrode 12. Thus, the thick film part 25 is formed in a strip shape including a line connecting the center 60, to which a stress is applied, and the extraction region 61. This structure can reinforce the area to which a stress is applied. Therefore, the crack 74 can be inhibited from being formed in the lower electrode 12.

Furthermore, when the resonance region 50 has an elliptical shape as in the first embodiment and the first variation, the extraction regions 61 and 63 are formed in the minor axis direction. This is for making the distance from the extraction region 61 or 63 to the edge of the resonance region 50 (the edge opposite from the extraction region 61 or 63) short to reduce the practical resistance of the lower electrode 12 or the upper electrode 16. Therefore, the crack 74 is formed near the minor axis 60a. In the case of an elliptical shape, a stress is likely to concentrate to the minor axis 60a more than to the major axis 60b. Thus, as described in the first embodiment and the first and second variations thereof, the thick film part 25 is formed in a strip shape including at least a part of the minor axis 60a of the elliptical shape. This structure can inhibit the crack 74 from being formed in the lower electrode 12.

Furthermore, the thick film part 25 is formed in a strip shape including the minor axis 60a. For example, the thick film part 25 is formed in a strip shape including the minor axis 60a between the center 60 and the extraction region 61 of the lower electrode 12. This structure can further inhibit the crack 74 from being formed in the lower electrode 12.

Furthermore, when the resonance region 50 has a polygonal shape as in the fifth and sixth variations of the first embodiment, as illustrated in FIG. 9A and FIG. 9B, the crack 74 is easily formed near the lines 66a and 66b respectively connecting the center 60 to the midpoints 65a and 65b of the sides 64a and 64b, on which the extraction regions 61 and 63 are respectively located, of a polygonal shape. Thus, the thick film part 25 is formed in a strip shape including at least a part of at least one of the lines 66a and 66b. This structure can further inhibit the crack 74 from being formed in the lower electrode 12.

Furthermore, the thick film part 25 is formed in a strip shape including the line 66a. This structure can further inhibit the crack 74 from being formed in the lower electrode 12.

The thick film part 25 may be formed in a strip shape parallel to the minor axis 60a or the line 66a or 66b, or may be formed in a strip shape non-parallel to the minor axis 60a or the line 66a or 66b. The width of the strip of the thick film part 25 may be uniform or may not necessarily be uniform.

Second Embodiment

Figure 10A:
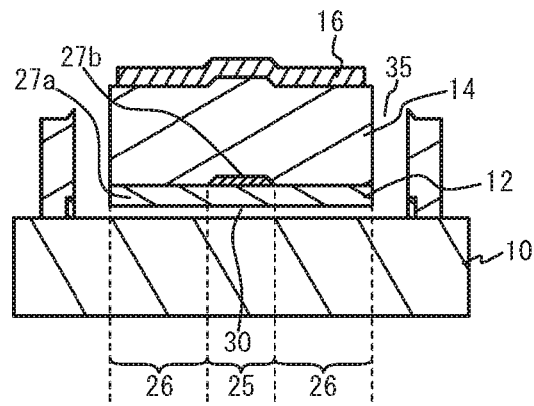
FIG. 10A is a cross-sectional view of a piezoelectric thin film resonator in accordance with a second embodiment.
Figure 10B:
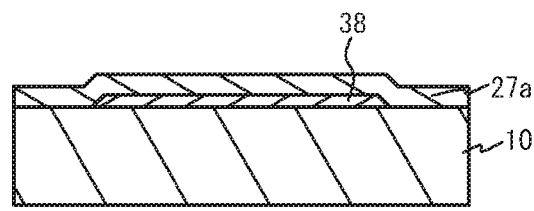
FIG. 10B through FIG. 10D are cross-sectional views illustrating a method of fabricating the piezoelectric thin film resonator in accordance with the second embodiment.
Figure 10C:
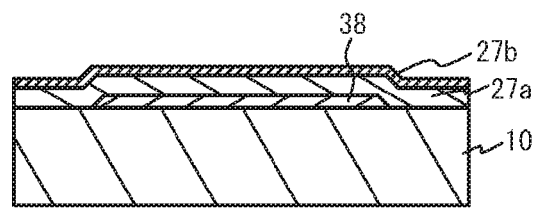
Figure 10D:
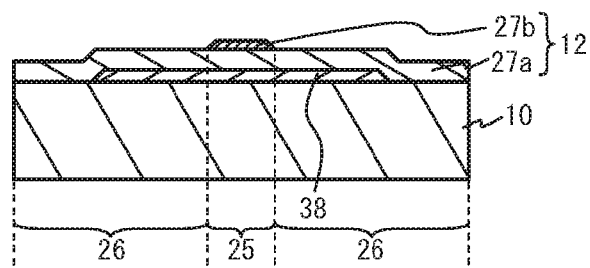

A second embodiment changes the structures of the thick film part 25 and the thin film part 26. FIG. 10A is a cross-sectional view of a piezoelectric thin film resonator in accordance with the second embodiment, and FIG. 10B through FIG. 10D are cross-sectional views illustrating a method of fabricating the piezoelectric thin film resonator in accordance with the second embodiment. As illustrated in FIG. 10A, a metal film 27a with a uniform film thickness is located in the thick film part 25 and the thin film part 26. In the thick film part 25, a metal film 27b is located on the metal film 27a. In the thin film part 26, the metal film 27b is not formed. The lower electrode 12 includes the metal films 27a and 27b. Other structures are the same as those of the first embodiment, and the description thereof is thus omitted.

As illustrated in FIG. 10B, the metal film 27a is formed on the sacrifice layer 38 and the substrate 10 after the step of FIG. 2A in the first embodiment. As illustrated in FIG. 10C, the metal film 27b is formed on the metal film 27a. The metal films 27a and 27b are formed by, for example, sputtering, vacuum evaporation, or CVD. As illustrated in FIG. 10D, a part, which is to be the thin film part 26, of the metal film 27b is removed by photolithography and etching. The metal film 27b in the thick film part 25 is not removed. The metal films 27a and 27b form the lower electrode 12. Subsequent steps are the same as those after the step of FIG. 2D in the first embodiment, and the description thereof is thus omitted.

In the second embodiment, the lower electrode 12 includes the metal film 27a (a first metal film) located in the thin film part 26 and the thick film part 25, and the metal film 27b (a second metal film) that is located on the metal film 27a in the thick film part 25 but is not located in the thin film part 26. This structure allows the thick film part 25 and the thin film part 26 to be formed in the resonance region 50. The metal film 27b can be selectively etched with respect to the metal film 27a as illustrated in FIG. 10D by making the materials of the metal films 27a and 27b different. Therefore, the distance t1 of the thin film part 26 can be produced precisely.

Figure 11A:
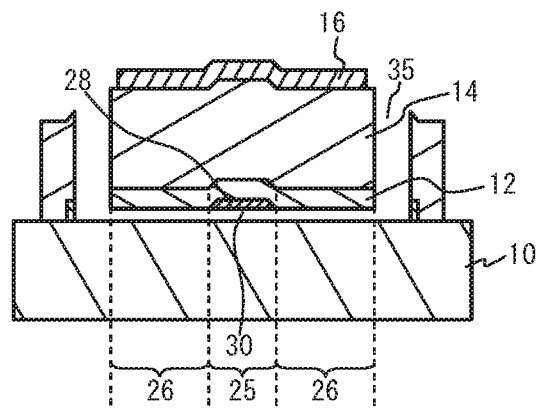
FIG. 11A is a cross-sectional view of a piezoelectric thin film resonator in accordance with a first variation of the second embodiment.
Figure 11B:
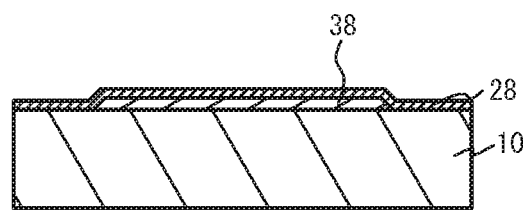
FIG. 11B through FIG. 11D are cross-sectional views illustrating a method of fabricating the piezoelectric thin film resonator in accordance with the first variation of the second embodiment.
Figure 11C:
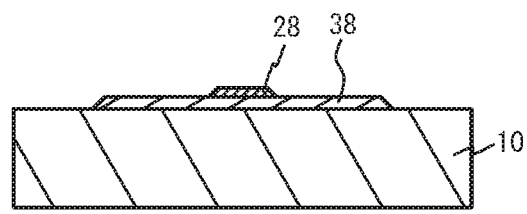
Figure 11D:
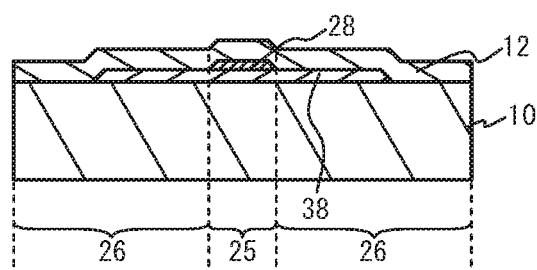

FIG. 11A is a cross-sectional view of a piezoelectric thin film resonator in accordance with a first variation of the second embodiment, and FIG. 11B through FIG. 11D are cross-sectional views illustrating a method of fabricating the piezoelectric thin film resonator in accordance with the first variation of the second embodiment. As illustrated in FIG. 11A, the lower electrode 12 with a uniform film thickness is located in the thick film part 25 and the thin film part 26. In the thick film part 25, an additional film 28 is located under the lower electrode 12. In the thin film part 26, the additional film 28 is not formed. The additional film 28 is, for example, an insulating film such as a silicon oxide film, a silicon nitride film, or a silicon oxide nitride film, or a metal film exemplified as the lower electrode 12. When the additional film 28 is a metal film, the additional film 28 forms a part of the lower electrode. Other structures are the same as those of the first embodiment, and the description thereof is thus omitted.

As illustrated in FIG. 11B, after the step of FIG. 2A in the first embodiment, the additional film 28 is formed on the sacrifice layer 38 and the substrate 10. The additional film 28 is formed by, for example, sputtering, vacuum evaporation, or CVD. As illustrated in FIG. 11C, a part, which is to be the thin film part 26, of the additional film 28 is removed by photolithography and etching. In the thick film part 25, the additional film 28 is not removed. As illustrated in FIG. 11D, the lower electrode 12 is formed on the sacrifice layer 38 and the additional film 28. Subsequent steps are the same as those after the step of FIG. 2D in the first embodiment, and thus the description thereof is omitted.

In the first variation of the second embodiment, the additional film 28 is located between the air gap 30 and the lower electrode 12 in the thick film part 25, and is not located in the thin film part 26. This structure allows the thick film part 25 and the thin film part 26 to be formed in the resonance region 50. As illustrated in FIG. 11D, since the lower electrode 12 is formed after the additional film 28 is formed, the distance t1 of the thin film part 26 can be produced precisely.

Figure 12A:
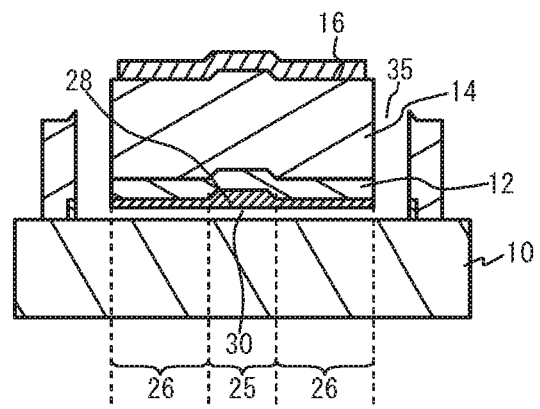
FIG. 12A is a cross-sectional view of a piezoelectric thin film resonator in accordance with a second variation of the second embodiment.
Figure 12B:
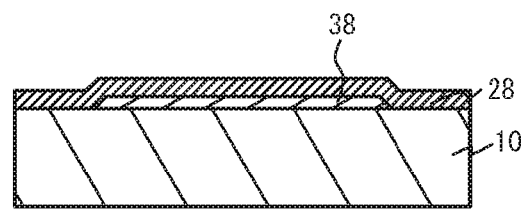
FIG. 12B through FIG. 12D are cross-sectional views illustrating a method of fabricating the piezoelectric thin film resonator in accordance with the second variation of the second embodiment.
Figure 12C:
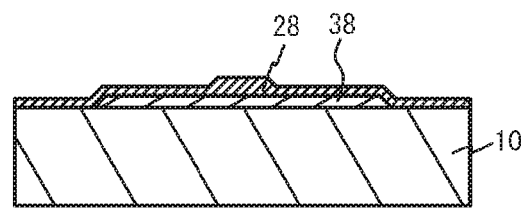
Figure 12D:
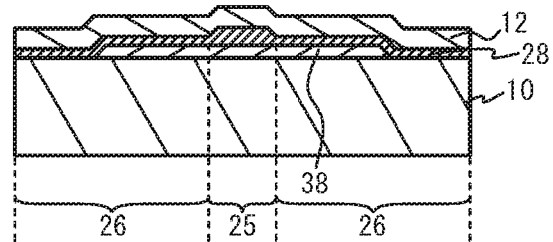

FIG. 12A is a cross-sectional view of a piezoelectric thin film resonator in accordance with a second variation of the second embodiment, and FIG. 12B through FIG. 12D are cross-sectional views illustrating a method of fabricating the piezoelectric thin film resonator in accordance with the second variation of the second embodiment. As illustrated in FIG. 12A, the lower electrode 12 with a uniform film thickness is located in the thick film part 25 and the thin film part 26. In the thick film part 25, the thick additional film 28 is located under the lower electrode 12. In the thin film part 26, the thin additional film 28 is located under the lower electrode 12. The additional film 28 is an insulating film or a metal film as in the first variation of the second embodiment. Other structures are the same as those of the first embodiment, and the description thereof is thus omitted.

As illustrated in FIG. 12B, after the step of FIG. 2A in the first embodiment, the additional film 28 is formed on the sacrifice layer 38 and the substrate 10. The additional film 28 is formed by, for example, sputtering, vacuum evaporation, or CVD. As illustrated in FIG. 12C, a part, which is to be the thin film part 26, of the additional film 28 is thinned by photolithography and etching. In the thick film part 25, the additional film 28 is not thinned. As illustrated in FIG. 12D, the lower electrode 12 is formed on the sacrifice layer 38 and the additional film 28. Subsequent steps are the same as those after the step of FIG. 2D in the first embodiment, and the description thereof is thus omitted.

In the second variation of the second embodiment, the film thickness of the additional film 28 in the thick film part 25 is greater than the film thickness of the additional film 28 in the thin film part 26. Located on the additional film 28 is the lower electrode 12 with a film thickness practically uniform in the thick film part 25 and the thin film part 26. This structure allows the thick film part 25 and the thin film part 26 to be formed in the resonance region 50.

The thick film part 25 and the thin film part 26 according to the second embodiment and the variations thereof may be applied to the first embodiment and the variations thereof.

Third Embodiment

Figure 13A:
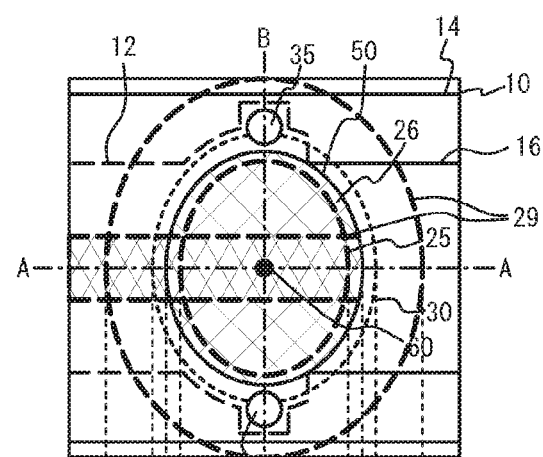
FIG. 13A is a plan view of a piezoelectric thin film resonator in accordance with a third embodiment.
Figure 13B:
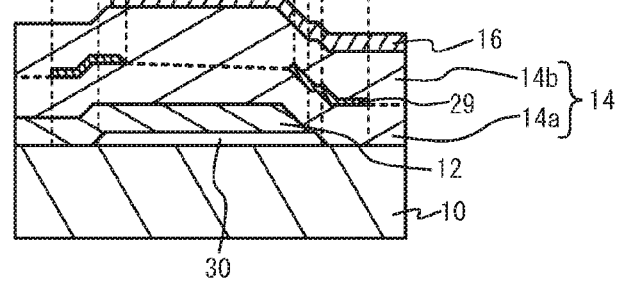
FIG. 13B is a cross-sectional view taken along line A-A in FIG. 13A.

A third embodiment provides an insertion film. FIG. 13A is a plan view of a piezoelectric thin film resonator in accordance with the third embodiment, and FIG. 13B is a cross-sectional view taken along line A-A in FIG. 13A. As illustrated in FIG. 13A and FIG. 13B, the piezoelectric film 14 includes a lower piezoelectric film 14a and an upper piezoelectric film 14b. An insertion film 29 is located between the lower piezoelectric film 14a and the upper piezoelectric film 14b. The insertion film 29 is located in an outer peripheral region 52 in the resonance region 50, and is not located in a central region 54. The outer peripheral region 52 is a region within the resonance region 50, includes the outer periphery of the resonance region 50, and is located along the outer periphery. The outer peripheral region 52 has, for example, a strip shape or a ring shape. The central region 54 is a region within the resonance region 50, and includes the center of the resonance region 50. The center may not necessarily be a geometric center. Other structures are the same as those of the first embodiment, and the description thereof is thus omitted.

Figure 14A:
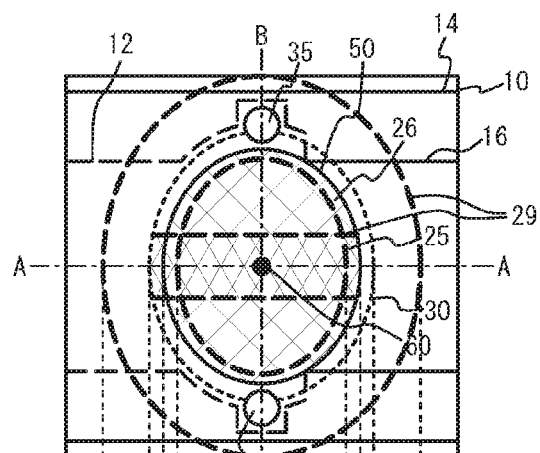
FIG. 14A is a plan view of a piezoelectric thin film resonator in accordance with a first variation of the third embodiment.
Figure 14B:
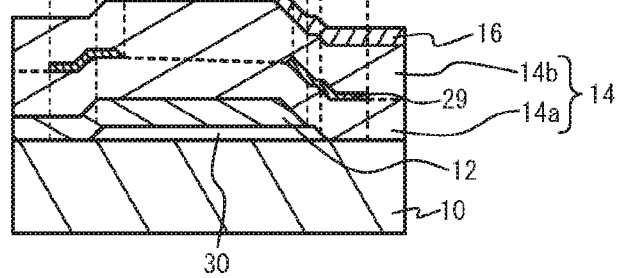
FIG. 14B is a cross-sectional view taken along line A-A in FIG. 14A.

FIG. 14A is a plan view of a piezoelectric thin film resonator in accordance with a first variation of the third embodiment, and FIG. 14B is a cross-sectional view taken along line A-A in FIG. 14A. As illustrated in FIG. 14A and FIG. 14B, the piezoelectric film 14 includes the lower piezoelectric film 14a and the upper piezoelectric film 14b. The insertion film 29 is located between the lower piezoelectric film 14a and the upper piezoelectric film 14b. Other structures are the same as those of the first variation of the first embodiment, and the description thereof is thus omitted.

In the third embodiment and the first variation thereof, the insertion film 29 can inhibit the leak of the acoustic wave from the resonance region 50 in the lateral direction. Accordingly, the Q-value of the piezoelectric thin film resonator can be improved. The insertion film 29 preferably has a Young's modulus and an acoustic impedance less than those of the piezoelectric film 14. For example, when the piezoelectric film 14 is mainly composed of aluminum nitride, the insertion film 29 is preferably an Al film, a gold (Au) film, a copper (Cu) film, a Ti film, a platinum (Pt) film, a tantalum (Ta) film, a Cr film, or a silicon oxide film. Especially, considering the Young's modulus, the insertion film 29 is preferably an Al film or a silicon oxide film.

As described in the third embodiment and the variation thereof, the insertion film 29 that is located in at least a part of the outer peripheral region 52 within the resonance region 50 and is not located in the central region 54 of the resonance region 50 may be formed between the lower electrode 12 and the upper electrode 16. The insertion film 29 may be located in the piezoelectric film 14, between the piezoelectric film 14 and the lower electrode 12, or between the piezoelectric film 14 and the upper electrode 16. The insertion film 29 may be provided in the first and second embodiments and the variations thereof.

Fourth Embodiment

Figure 15A:
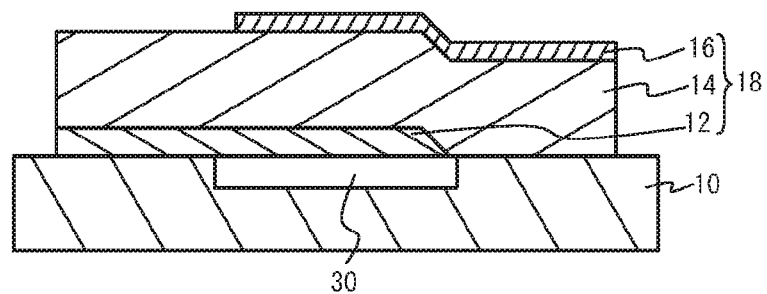
FIG. 15A and FIG. 15B are cross-sectional views of piezoelectric thin film resonators in accordance with a fourth embodiment and a first variation, respectively.
Figure 15B:
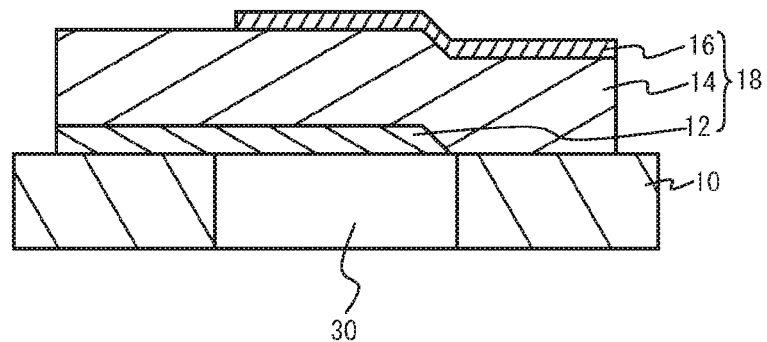

A fourth embodiment changes the structure of the air gap 30. FIG. 15A and FIG. 15B are cross-sectional views of piezoelectric thin film resonators in accordance with the fourth embodiment and a first variation, respectively. As illustrated in FIG. 15A, a recess is formed on the upper surface of the substrate 10. The lower electrode 12 is flatly formed on the substrate 10. Accordingly, the air gap 30 is formed in the recess of the substrate 10. Other structures are the same as those of the first embodiment, and the description thereof is thus omitted. As illustrated in FIG. 15B, the air gap 30 penetrating through the substrate 10 is formed. Other structures are the same as those of the first embodiment, and the description thereof is thus omitted.

As described in the fourth embodiment and the variation thereof, the air gap 30 may not necessarily be dome-shaped. Even when the lower surface of the lower electrode 12 is flat as in the fourth embodiment and the first variation, a stress is applied to the lower electrode 12. Therefore, the crack 74 is formed in the lower electrode 12. Thus, the crack 74 can be inhibited from being formed in the lower electrode 12 by forming the thick film part 25 and the thin film part 26 in the lower electrode 12 within the resonance region 50. An insulating film may be formed so as to make contact with the lower surface of the lower electrode 12. That is, the air gap 30 may be formed between the substrate 10 and an insulating film making contact with the lower electrode 12. The insulating film may be, for example, an aluminum nitride film.

The air gap 30 described in the fourth embodiment and the variation thereof may be applied to the first through third embodiments and the variations thereof.

Fifth Embodiment

Figure 16A:
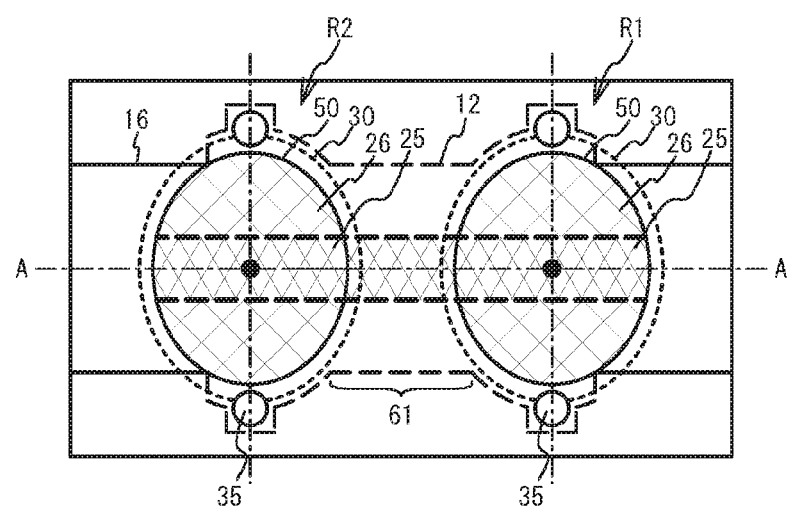
FIG. 16A is a plan view of a piezoelectric thin film resonator in accordance with a fifth embodiment.
Figure 16B:
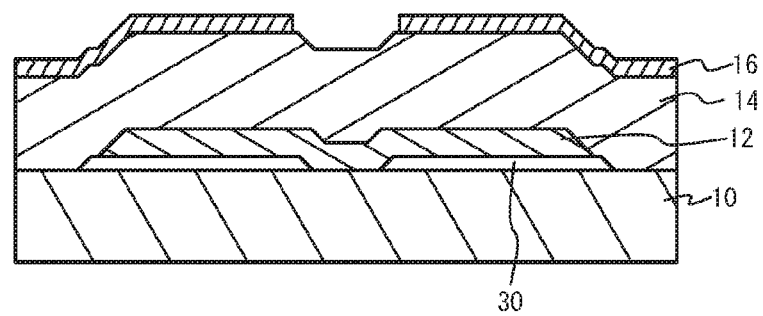
FIG. 16B is a cross-sectional view taken along line A-A in FIG. 16A.

A fifth embodiment provides a plurality of piezoelectric thin film resonators. FIG. 16A is a plan view of piezoelectric thin film resonators in accordance with the fifth embodiment, and FIG. 16B is a cross-sectional view taken along line A-A in FIG. 16A. As illustrated in FIG. 16A and FIG. 16B, piezoelectric thin film resonators R1 and R2 in accordance with the first embodiment are connected in series through the lower electrode 12. The extraction region 61 is shared by the piezoelectric thin film resonators R1 and R2. The thick film part 25 is continuously located in the resonance regions 50 of the piezoelectric thin film resonators R1 and R2 and the extraction region 61. Other structures are the same as those of the first embodiment, and the description thereof is thus omitted.

In the fifth embodiment, in the adjacent piezoelectric thin film resonators R1 and R2, the lower electrode 12 and the thick film part 25 are continuously formed. This structure can further enhance the strength of the lower electrode 12.

Figure 17:
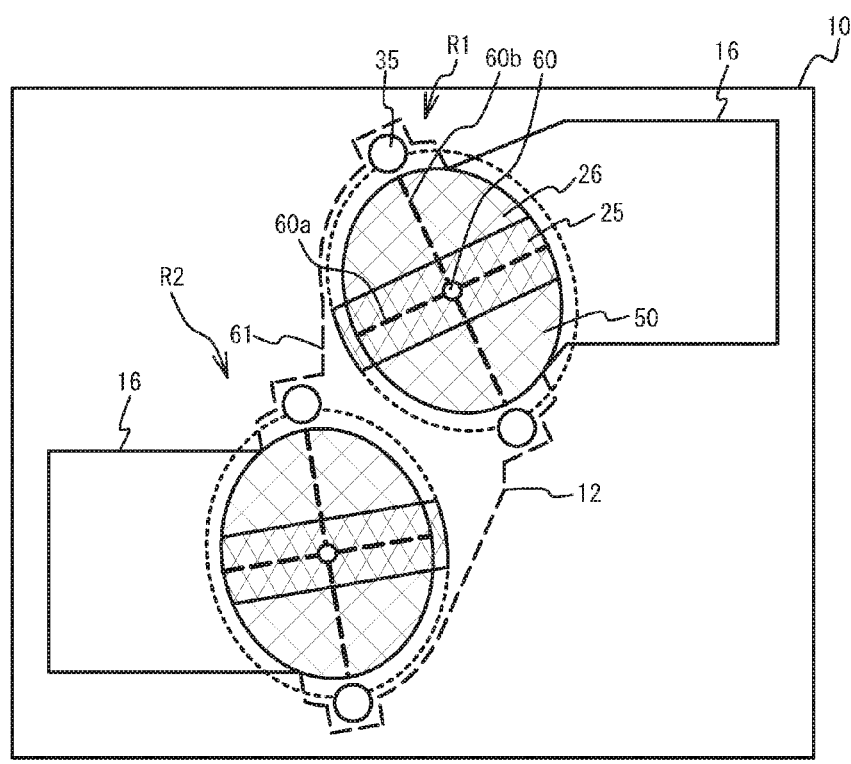
FIG. 17 is a plan view of a piezoelectric thin film resonator in accordance with a first variation of the fifth embodiment.

FIG. 17 is a plan view of piezoelectric thin film resonators in accordance with a first variation of the fifth embodiment. As illustrated in FIG. 17, the piezoelectric thin film resonators R1 and R2 in accordance with the first variation of the first embodiment are connected in series through the lower electrode 12. The extraction region 61 is shared by the piezoelectric thin film resonators R1 and R2. The thick film part 25 is not located in the extraction region 61. The directions of the minor axes 60a of the piezoelectric thin film resonators R1 and R2 differ from each other. Each of the thick film parts 25 of the piezoelectric thin film resonators R1 and R2 is formed so as to include the corresponding minor axis 60a. Other structures are the same as those of the fifth embodiment, and the description thereof is thus omitted.

As described in the first variation of the fifth embodiment, the directions of the minor axes 60a may differ between the piezoelectric thin film resonators R1 and R2. Even when the piezoelectric thin film resonators R1 and R2 share the extraction region 61, the thick film part 25 may not be necessarily located in the extraction region 61.

Sixth Embodiment

Figure 18:
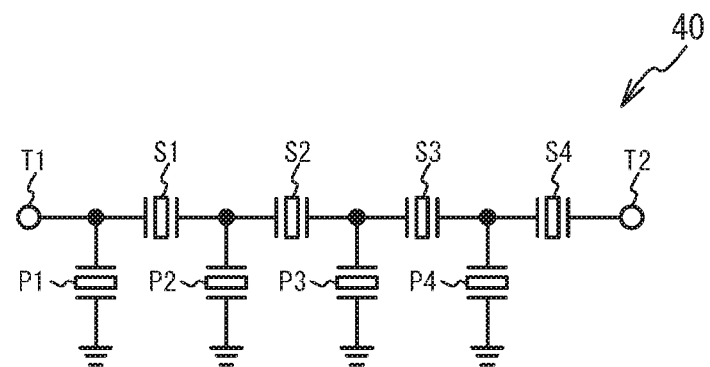
FIG. 18 is a circuit diagram of a filter in accordance with a sixth embodiment.

A sixth embodiment uses the piezoelectric thin film resonator according to any one of the first through fifth embodiments and the variations thereof for a filter. FIG. 18 is a circuit diagram of a filter in accordance with the sixth embodiment. As illustrated in FIG. 18, in a filter 40, one or more series resonators S1 through S4 are connected in series between an input terminal T1 and an output terminal T2. One or more parallel resonators P1 through P4 are connected in parallel between the input terminal T1 and the output terminal T2. At least one of one or more series resonators S1 through S4 and one or more parallel resonators P1 through P4 may be the piezoelectric thin film resonator according to any one of the first through fifth embodiments and the variations thereof. The number of resonators in a ladder-type filter can be appropriately designed. A filter including the acoustic wave resonator according to any one of the first through fifth embodiments and the variations thereof may be a multimode filter instead of a ladder-type filter.

Figure 19A:
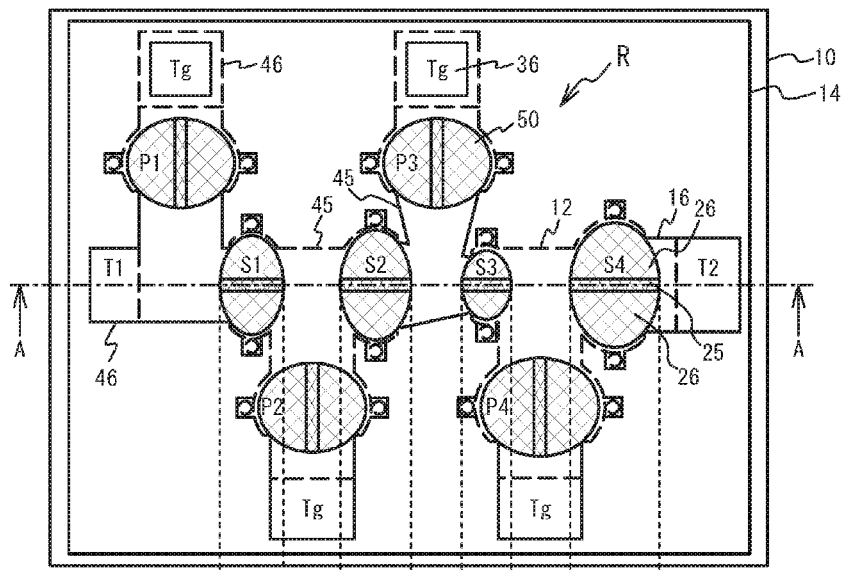
FIG. 19A is a plan view of a filter in accordance with a first variation of the sixth embodiment.
Figure 19B:
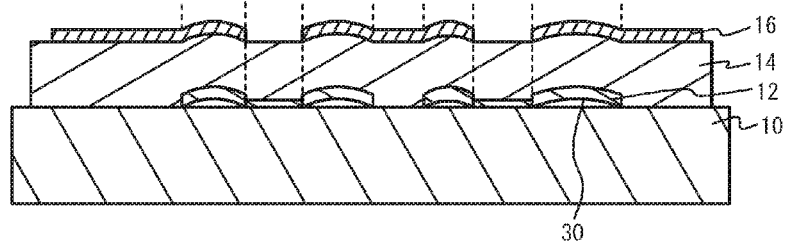
FIG. 19B is a cross-sectional view taken along line A-A in FIG. 19A.

FIG. 19A is a plan view of a filter in accordance with a first variation of the sixth embodiment, and FIG. 19B is a cross-sectional view taken along line A-A in FIG. 19A. As illustrated in FIG. 19A and FIG. 19B, a plurality of piezoelectric thin film resonators R are located on the same substrate 10. The piezoelectric thin film resonators R include the series resonators S1 through S4 and the parallel resonators P1 through P4 of the sixth embodiment. The piezoelectric thin film resonators R are electrically interconnected by wiring lines 45. The piezoelectric thin film resonators R are electrically connected to pads 46. A bonding wire or a bump is located on the pad 46. The pads 46 include the input terminal T1, the output terminal T2, and ground terminals Tg. The wiring lines 45 and the pads 46 are formed of the lower electrode 12 or the upper electrode 16. When the pad 46 is formed of the lower electrode 12, an aperture 36 is formed in the piezoelectric film 14.

The thick film part 25 is only located in the resonance region 50 of each piezoelectric thin film resonator R. The wiring lines 45 and the pads 46 formed of the lower electrode 12 are the thin film part 26. The dimensions and the shapes of the resonance regions 50 of the series resonators S1 through S4 and the parallel resonators P1 through P4 can be appropriately changed. Other structures are the same as those of the first variation of the first embodiment, and the description thereof is thus omitted.

The pad 46 formed of the lower electrode 12 is the thin film part 26, and has no level difference formed. Thus, the bonding of a bonding wire or a bump to the pad 46 becomes easy. The distance t1 (see FIG. 1D) of the thick film part 25 is the same among the piezoelectric thin film resonators R. The distance t2 (see FIG. 1D) of the thin film part 26 is the same among the piezoelectric thin film resonators R. Accordingly, the fabrication process can be simplified. The location, the dimension, and/or the shape of the thick film part 25 can be freely set among the piezoelectric thin film resonators R.

Figure 20A:
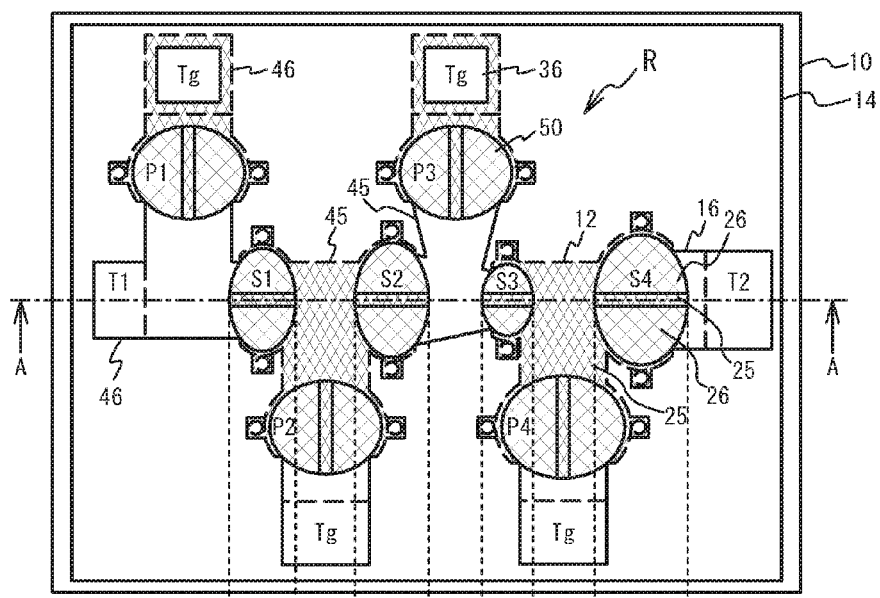
FIG. 20A is a plan view of a filter in accordance with a second variation of the sixth embodiment.
Figure 20B:
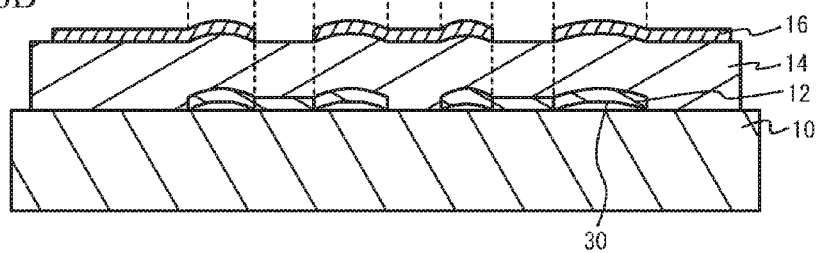
FIG. 20B is a cross-sectional view taken along line A-A in FIG. 20A.

FIG. 20A is a plan view of a filter in accordance with a second variation of the sixth embodiment, and FIG. 20B is a cross-sectional view taken along line A-A in FIG. 20A. As illustrated in FIG. 20A and FIG. 20B, the lower electrode 12 other than the lower electrode 12 in the resonance region 50 is the thick film part 25. Other structures are the same as those of the first variation of the sixth embodiment, and the description thereof is thus omitted. The pad 46 formed of the lower electrode 12 is the thin film part 26, and has no level difference formed. Accordingly, the bonding of a bonding wire or a bump to the pad 46 becomes easy.

Figure 21A:
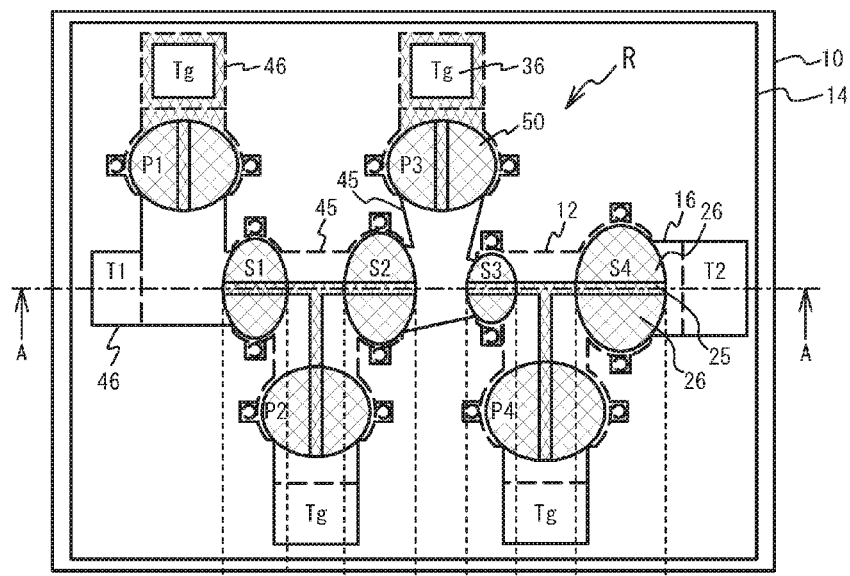
FIG. 21A is a plan view of a filter in accordance with a third variation of the sixth embodiment.
Figure 21B:
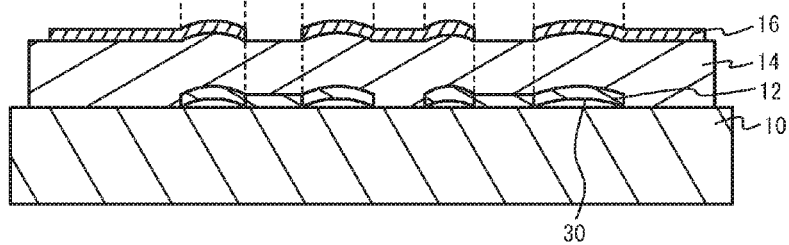
FIG. 21B is a cross-sectional views taken along line A-A in FIG. 21A.

FIG. 21A is a plan view of a filter in accordance with a third variation of the sixth embodiment, and FIG. 21B is a cross-sectional view taken along line A-A in FIG. 21A. As illustrated in FIG. 21A and FIG. 21B, the lower electrode 12 of the pad 46 is the thick film part 25. The thick film part 25 is formed in the lower electrode 12 of the wiring line 45 interconnecting the piezoelectric thin film resonators R. Other structures are the same as those of the first variation of the sixth embodiment, and the description thereof is thus omitted. The thick film part 25 is continuously formed between the adjacent piezoelectric thin film resonators R. This structure can further enhance the strength of the lower electrode 12. The pad 46 formed of the lower electrode 12 is the thin film part 26, and has no level difference formed. Accordingly, the bonding of a bonding wire or a bump to the pad 46 becomes easy.

Seventh Embodiment

Figure 22:
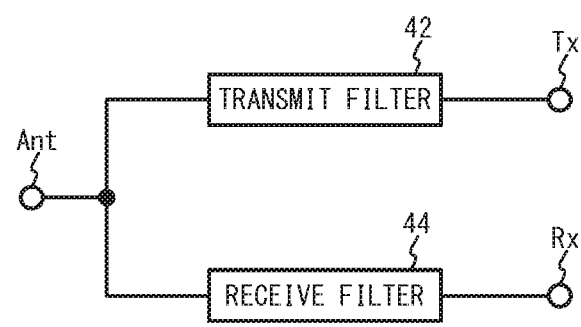
FIG. 22 is a circuit diagram of a duplexer in accordance with a seventh embodiment.

A seventh embodiment is an exemplary duplexer. FIG. 22 is a circuit diagram of a duplexer in accordance with the seventh embodiment. As illustrated in FIG. 22, a transmit filter 42 is connected between a common terminal Ant and a transmit terminal Tx. A receive filter 44 is connected between the common terminal Ant and a receive terminal Rx. The transmit filter 42 transmits signals in the transmit band to the common terminal Ant as transmission signals among signals input from the transmit terminal Tx, and suppresses signals with other frequencies. The receive filter 44 transmits signals in the receive band to the common terminal Ant as reception signals among signals input from the common terminal Ant, and suppresses signals with other frequencies. At least one of the transmit filter 42 or the receive filter 44 may be the filter according to any one of the sixth embodiment and the variations thereof.

Alternatively, at least one of the transmit filter 42 or the receive filter 44 may be a filter including the piezoelectric thin film resonator according to any one of the first through fifth embodiments and the variations thereof.

A duplexer has been described as an example of a multiplexer, but the multiplexer may be a triplexer or a quadplexer.

Although the embodiments of the present invention have been described in detail, it is to be understood that the various change, substitutions, and alterations could be made hereto without departing from the spirit and scope of the invention.

What is claimed is:

1. A piezoelectric thin film resonator comprising:
    a substrate;
    a piezoelectric film that is located on the substrate;
    a lower electrode that is located on the substrate through an air gap, makes contact with the piezoelectric film, and includes a thin film part and a thick film part in which a distance from the air gap to a surface making contact with the piezoelectric film is greater than that in the thin film part in a region overlapping with the air gap in plan view; and
    an upper electrode that is located on an opposite surface of the piezoelectric film from a surface making contact with the lower electrode,
    wherein the thin film part and the thick film part are located in a resonance region defined by a region where the lower electrode and the upper electrode overlap across the piezoelectric film, and the thick film part includes at least a center of the region overlapping with the air gap in plan view.

2. A multiplexer comprising:
    a filter including the piezoelectric thin film resonator according to claim 1.

3. The piezoelectric thin film resonator according to claim 1, wherein
    the thick film part has a strip shape including a line connecting a center of the region and an extraction region to which the lower electrode is extracted from a resonance region in which the lower electrode and the upper electrode overlap across the piezoelectric film.

4. The piezoelectric thin film resonator according to claim 1, wherein
    the region has an elliptical shape, and the thick film part has a strip shape including at least a part of a minor axis of the elliptical shape.

5. The piezoelectric thin film resonator according to claim 1, wherein the region has a polygonal shape, and the thick film part has a strip shape including at least a part of at least one of lines connecting a center of the region and midpoints of sides, on which extraction regions to which the lower electrode and the upper electrode are extracted from a resonance region are located, of the polygonal shape, the lower electrode and the upper electrode overlapping across the piezoelectric film in the resonance region.

6. The piezoelectric thin film resonator according to claim 1, wherein the thick film part includes at least a center of the resonance region.

7. The piezoelectric thin film resonator according to claim 1, wherein
the lower electrode in the thick film part is thicker than the lower electrode in the thin film part.

8. The piezoelectric thin film resonator according to claim 1, further comprising
an insertion film that is located in at least a part of an outer periphery region within a resonance region where the lower electrode and the upper electrode face each other across the piezoelectric film, and is not located in a central region of the resonance region, the insertion film being located between the lower electrode and the upper electrode.

9. A filter comprising:
the piezoelectric thin film resonator according to claim 1.

10. The filter according to claim 9, further comprising:
a plurality of the piezoelectric thin film resonators, wherein
the lower electrode and the thick film part are continuously formed in adjacent piezoelectric thin film resonators of the plurality of the piezoelectric thin film resonators.

11. An piezoelectric thin film resonator comprising:
a substrate;
a piezoelectric film that is located on the substrate;
a lower electrode that is located on the substrate through an air gap, makes contact with the piezoelectric film, and includes a thin film part and a thick film part in which a distance from the air gap to a surface making contact with the piezoelectric film is greater than that in the thin film part in a region overlapping with the air gap in plan view; and
an upper electrode that is located on an opposite surface of the piezoelectric film from a surface making contact with the lower electrode,
wherein the thick film part has a strip shape including at least a part of at least one of lines connecting a center of the region and extraction regions to which the lower electrode and the upper electrode are extracted from a resonance region in which the lower electrode and the upper electrode overlap across the piezoelectric film.

12. An piezoelectric thin film resonator comprising:
a substrate;
a piezoelectric film that is located on the substrate;
a lower electrode that is located on the substrate through an air gap, makes contact with the piezoelectric film, and includes a thin film part and a thick film part in which a distance from the air gap to a surface making contact with the piezoelectric film is greater than that in the thin film part in a region overlapping with the air gap in plan view;
an upper electrode that is located on an opposite surface of the piezoelectric film from a surface making contact with the lower electrode; and
an additional film that is located between the air gap and the lower electrode in the thick film part, and is not located in the thin film part.

* * * * *